United States Patent [19]

Crowley

[11] Patent Number: 4,983,907
[45] Date of Patent: Jan. 8, 1991

[54] DRIVEN GUARD PROBE CARD

[75] Inventor: Richard N. Crowley, Aloha, Oreg.

[73] Assignee: Intel Corporation, Santa Clara, Calif.

[21] Appl. No.: 323,121

[22] Filed: Mar. 9, 1989

Related U.S. Application Data

[63] Continuation of Ser. No. 50,223, May 14, 1987, abandoned.

[51] Int. Cl.$^5$ .............................................. G01R 1/073
[52] U.S. Cl. .................................................. 324/158 P
[58] Field of Search ........... 324/158 F, 158 P, 73 PC, 324/73 R, 72.5

[56] References Cited

U.S. PATENT DOCUMENTS

| | | | |
|---|---|---|---|
| 3,963,986 | 6/1976 | Morton et al. | 324/158 F |
| 4,139,813 | 2/1979 | Shaffer | 324/72.5 X |
| 4,161,692 | 7/1979 | Tarzwell | 324/158 P |
| 4,605,894 | 8/1986 | Cox et al. | 324/73 R |
| 4,646,299 | 2/1987 | Schinabeck et al. | 324/73 R X |
| 4,656,416 | 4/1987 | Brasfield | 324/133 X |
| 4,694,242 | 9/1987 | Peterson et al. | 324/73 R |
| 4,757,256 | 7/1988 | Whann et al. | 324/158 P |

FOREIGN PATENT DOCUMENTS 8000101  1/1980  World Int. Prop. O. ......... 324/72.5

Primary Examiner—Jerry Smith
Assistant Examiner—Stephen M. Baker
Attorney, Agent, or Firm—Blakely, Sokoloff, Taylor & Zafman

[57] ABSTRACT

A semiconductor probe card with electrically separate driven guards for each probe. The probe card has electrically separate fingers surrounding each signal point contact which act as driven guards for reducing leakage problems and stray capacitance on the card. Microstrip ceramic blade probes are attached to the card at each finger. The microstrip ceramic blade probes have a conducting trace on one side which provides connection between the circuit being tested and the testing equipment. The other side and the mounting surface of the probe have ground planes which act as driven guards to further reduce leakage and stray capacitance. When connected to the testing equipment, the testing equipment drives the fingers and the ground planes on the probe to the same potential as the signal from the circuit.

13 Claims, 4 Drawing Sheets

DRIVEN GUARD PROBE CARD

This is a continuation of application Ser. No. 050,223 filed May 14, 1987, now abandoned.

BACKGROUND OF THE INVENTION

1. Field of the Invention

The invention relates the field of semiconductor testing equipment and, more specifically, to the field of probe cards for semiconductor test systems.

2. Prior Art

Presently available probe cards make use of conventional printed circuit techniques using long unshielded and unguarded traces. These probe cards suffer from use of insulating and structural materials without regard for leakage characteristics. In addition, use of conventional printed circuit edge connectors add stray leakage and capacitance. These probe cards are not intended to address stray leakage and capacitance problems encountered in testing systems of today's technology. The previous state of the art did not require low-leakage, low-capacitance probe cards because tester equipment could perform these sensitive tests on only a few device pins, which made it impractical to use probe cards. As the size of devices become smaller and smaller, lower current, voltages, and capacitances must be measured. Test system vendors have met this demand with their latest generation of products, such as Hewlett-Packard's HP4062. However, there has been no corresponding progress in probe card technology.

Probe cards presently available fall into two categories: General purpose and high-performance alternating current (AC). The general purpose probe cards use conventional printed circuit design and layout technology, and use insulating and structural features (e.g. epoxy ring) which have provided adequate performance for previous generations of semiconductor technology, both in the development and production environments. However, these methods of construction impose leakage currents on the order of 25 times greater than the capability of the available test systems, and stray capacitance on the order of 10 times that of the test systems. Most of this leakage and stray capacitance is the direct result of the probe card printed circuit, but some of it results from the necessary printed circuit board edge connector, with the epoxy probe ring adding more leakage.

The high-performance AC probe cards were developed for the testing of finished product dice at operating speed. They provide features such as coaxial wiring, ground planes, and microstrip blade probes. These features address the major problems of this type of testing, such as impedence matching, (addressed by coaxial lead wiring and microstrip construction), and noise (addressed by ground plane design).

In order to achieve uniformity of impedance, microstrip ceramic blade probes are used in the high-performance AC probe cards. Probe card vendors have designed ceramic blade probes which use a ground plane on one side of the ceramic blade and a microstrip trace on the opposite side for connecting the probe to the chip. In current practice, the ground plane side of the blade is soldered to the ground plane of the probe card. The ground plane of the probe card usually consists of the entire top surface of the probe card.

In addition, in the latest generation of testing equipment one method of achieving low-leakage has been the use of a driven guard. This driven guard is an additional "shield" which is achieved by driving the ground planes to the same potential as the measured signal conductor. Since there is no perfect insulating material, any insulator has some conductance. By providing a potential at the non-signal end of the insulator which is identical to the signal of interest, no leakage current will flow through this insulator. This method of using driven guards has not, to the Applicant's knowledge, been previously applied to probe card technology.

SUMMARY OF THE INVENTION

The present invention discloses a means for reducing or eliminating leakage and stray capacitance in semiconductor probe cards. The means involves a probe card of new design with a driven guard for each probe. Although the use of a driven guard is known in the prior art, a unique feature of the present invention is the use of a separate ground plane or driven guard for each probe. Another feature is a means for conduction of the guard potential back from the testing equipment.

Utilizing a round probe card and ceramic blade probes with microstrip traces the present invention is able to reduce or eliminate leakage and stray capacitance problems. The probes have a microstrip trace on one side and a ground plane on the mounting surface and the other side.

The ceramic blade probe card has a plurality of fingers on the top and the bottom of the card consisting of the driven guard lands and a signal pad. The signal pad is connected to the signal pin from the tester. The signal pad is surrounded around all edges on the top and from the bottom by the driven guard land. The driven guard land is electrically coupled to the driven guard voltage of the tester. Each driven guard land is electrically separate and isolated from the other lands.

Coupling of the the probe card to the test equipment is accomplished with a spring contact probe. The spring contact probe contacts the pads on the surface of the probe card and is electrically coupled to the tester. Also disclosed is an apparatus for coupling the probe card to an alignment adapter card for use during construction and repair of the probe card.

The present invention offers a number of unique features over the prior art. A separate guard plane is provided for each probe and an apparatus for conduction of the guard potential back from the test equipment is provided.

DETAILED DESCRIPTION OF THE INVENTION

A driven guard probe card is described. In the following description, numerous specific details are set forth such as specific dimensions, number of probes and probe landings, etc., in order to provide a thorough understanding of the invention. It will be obvious however, to one skilled in the art that the present invention may be practiced without these specific details. In other instances, well known structures and processing steps have not been described in detail in order not to unnecessarily obscure the invention.

Figure 1:
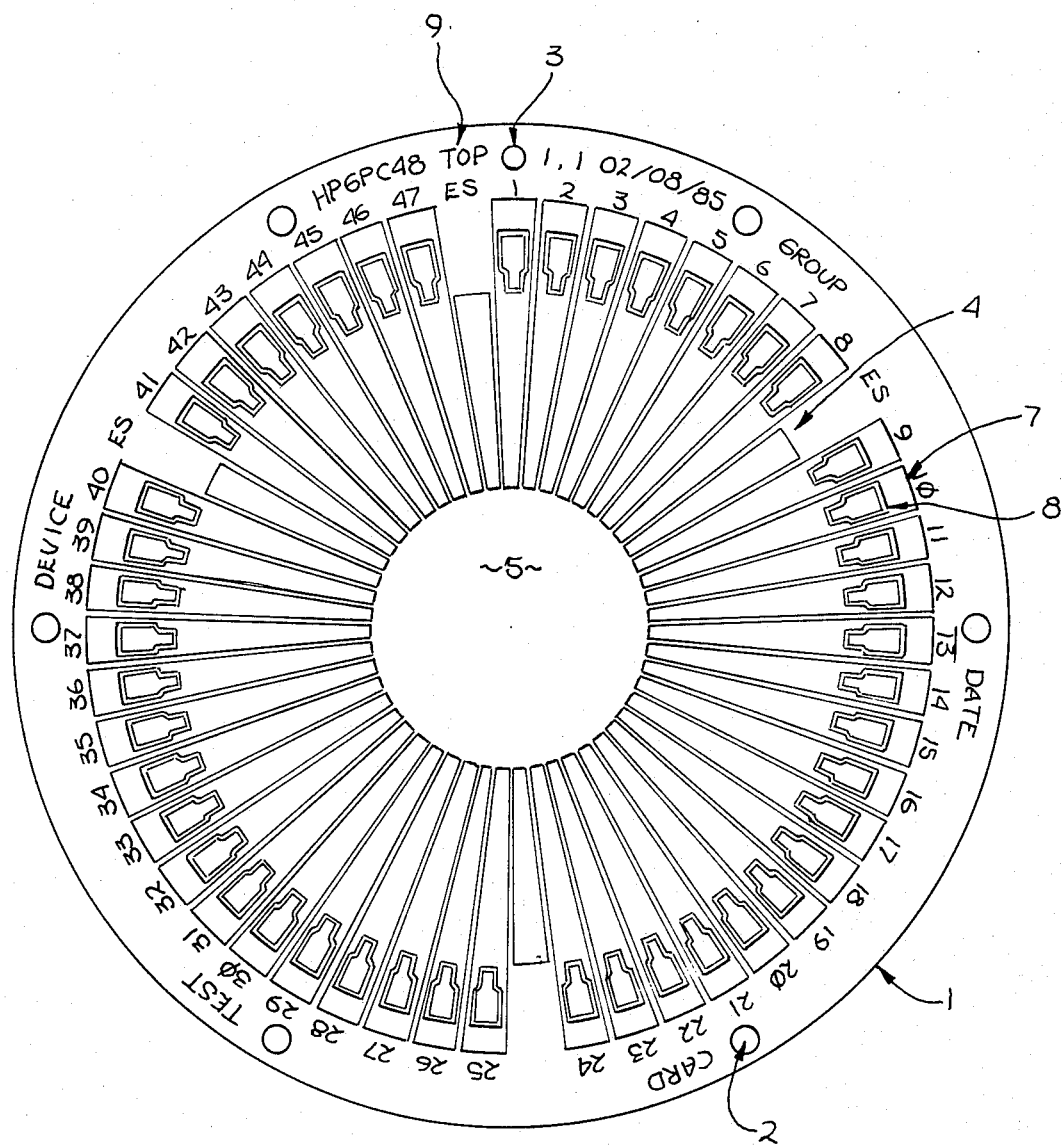
FIG. 1 illustrates a top view of the probe card as illustrated by the present invention.
Figure 3:
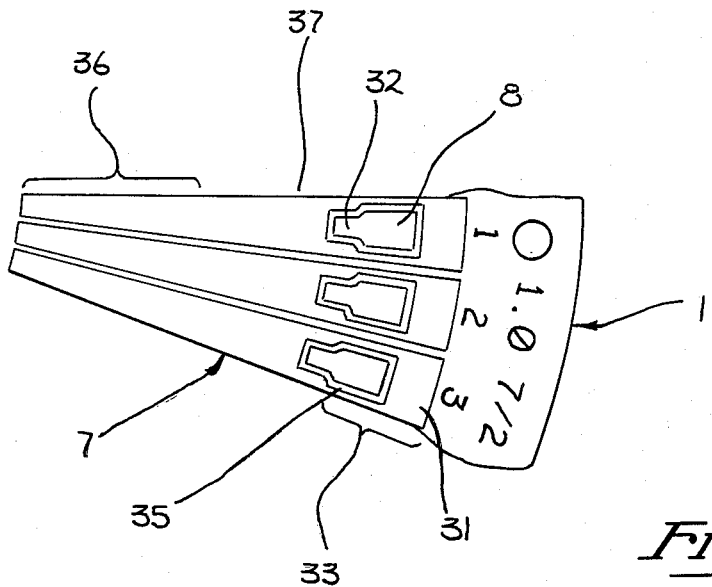
FIG. 3 illustrates details of the top side of the probe card.

As shown in FIG. 1, in the presently preferred embodiment a ceramic blade round probe card 1 is disclosed. The probe card has a diameter of approximately 4 inches and has a 1.1 inch diameter hole 5 through the center. In the presently preferred embodiment there are 47 blades, or fingers 7 on each side of the probe card. FIG. 3 details the top side of the probe card. Each finger 7 consists of a probe blade mounting area 36, a plated through hole 37, a signal pad 8, and a guard contact point 31. The signal pad 8 consists of a signal contact point 35 and a neck area 32. It will be obvious to one skilled in the art that the number of probes and dimensions may vary depending on the specific test equipment being used and other factors. An alternative to the presently preferred embodiment would gold plate area 33 to provide improved electrical coupling.

Referring again to FIG. 1 the top of the card also has edge sensor fingers 4, and has holes through the card at the outer edge 2 used for mounting the card to the test equipment or to an adapter card. In addition, there is a reference hole 3 used for aligning the card in the test equipment and on the adapter card. The top of the card is identified with the word "TOP" 9.

Figure 2:
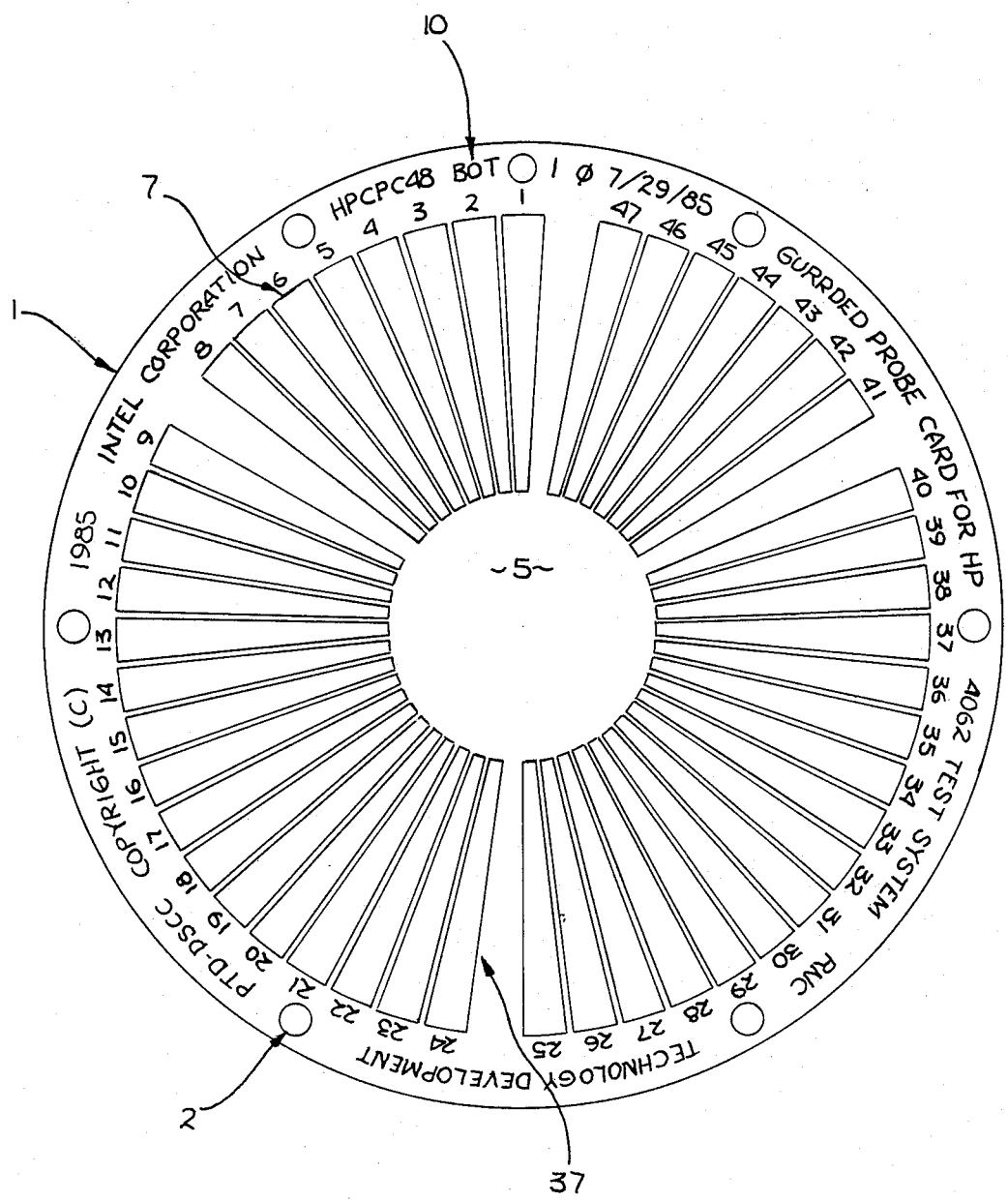
FIG. 2 illustrates a bottom view of the probe card.

Referring now to FIG. 2, the bottom of the probe card used in the preferred embodiment is disclosed. The bottom of the probe card has electrically separate and isolated probe card fingers 7 which act as driven guards. The bottom of the probe card is identified with a marking "BOT" 10. The plated thru-hole 37 conducts the guard voltage to the individual probe card fingers 7 from the top side contact 31 and finger 7.

Figure 4:
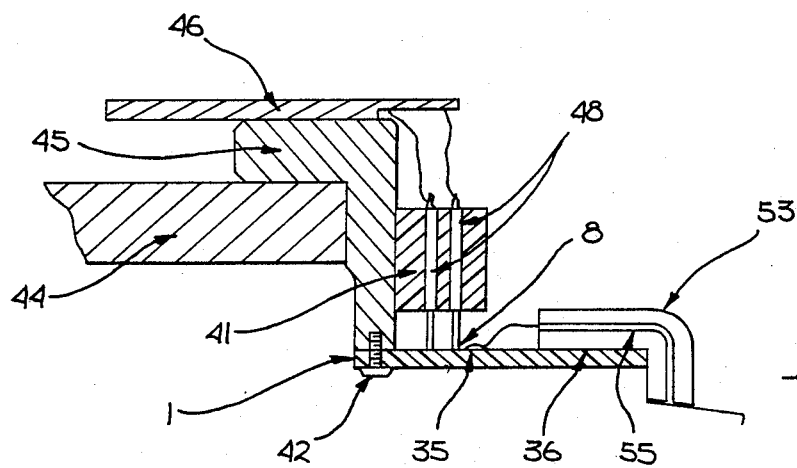
FIG. 4 is a one-half cross sectional view of the probe card mounted in a tester assembly.

Referring now to FIG. 4, an aparatus for mounting the probe card in a tester assembly is disclosed. The probe card is held in place in the assembly with screws 42 which go through the screw holes 2 on the probe card 1. Mounted on the probe card are probes 53. The bottom side of each probe 53 is coupled with the probe blade mounting area 36. The trace 55 is coupled with the signal contact point 35 on the probe card 1. Electrical coupling with the testing equipment is accomplished with two spring contact probes 48 which contact the signal pad 8 and the guard contact point 31. There are two spring contact probes 48 for each of the probe card fingers 7 on the probe card 1. One pin 48 carries the signal and the other carries the driven guard voltage. The spring contact probes 48 used in the preferred embodiment are made by Contact Products, a Division of Everett Charles of Pomona, Calif. The spring contact probes 48 are retained in a Delrin TM ring 41 mounted directly inside an Electroglas TM probe card adapter 45. The Electroglas TM probe card adapter 45 is coupled with an Electroglas TM ring insert 44 in the preferred embodiment and is coupled with the tester board 46. The spring contact probes 48 are electrically coupled to the tester board 46. The Electroglas TM probe card adapter 45 and ring insert 44 are manufactured by Electroglas Corporation of Santa Clara, Calif. The Delrin TM ring is manufactured by American Precision Industries of Hillsboro, Oreg. It will be obvious to one skilled in the art that substitute products, vendors and specifications may be used in other embodiments of the invention.

Figure 5:
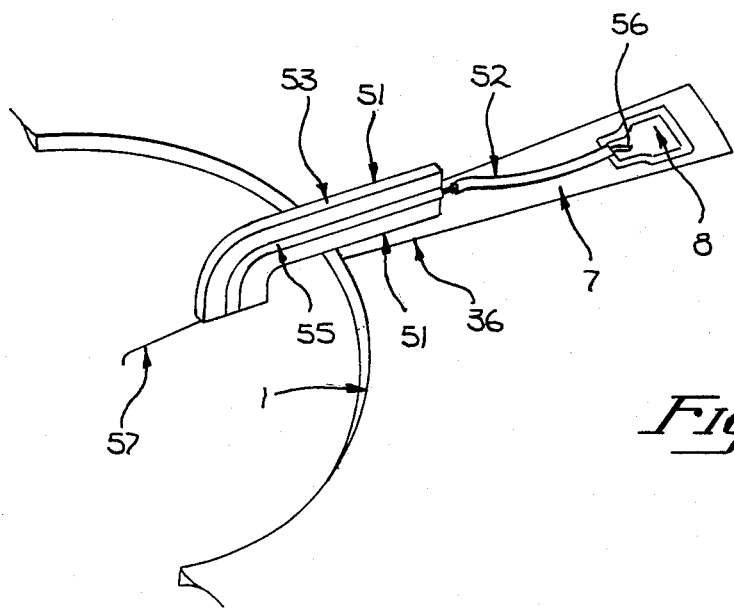
FIG. 5 is a perspective view of a microstrip blade probe as used in the present invention.

Referring now to FIG. 5, the microstrip ceramic blade probes 53 used in the present invention are disclosed. The probes used in the present invention are made by Cerprobe Corporation of Sunnyvale, Calif. The ceramic blade probe 53 has a ground plane 51 on one side and on the mounting surface (bottom) of the blade. A trace 55 is on the other side of the blade which connects to the connecting wire 52 and the probe tip 57.

The ground plane feature 51 of the ceramic blade probe 53 is used to turn the ground plane 51 into a driven guard. This is accomplished by causing the mounting surface for the ceramic blade probe 53 to be connected to the driven guard potential from the tester by being coupled to the probe card fingers 7 at the probe blade mounting area 36. The corresponding signal pin 48 from the tester is electrically coupled to the trace 55 on the probe through the signal pad 8 and through the connecting wire 52 connects to the probe tip 57.

Figure 6:
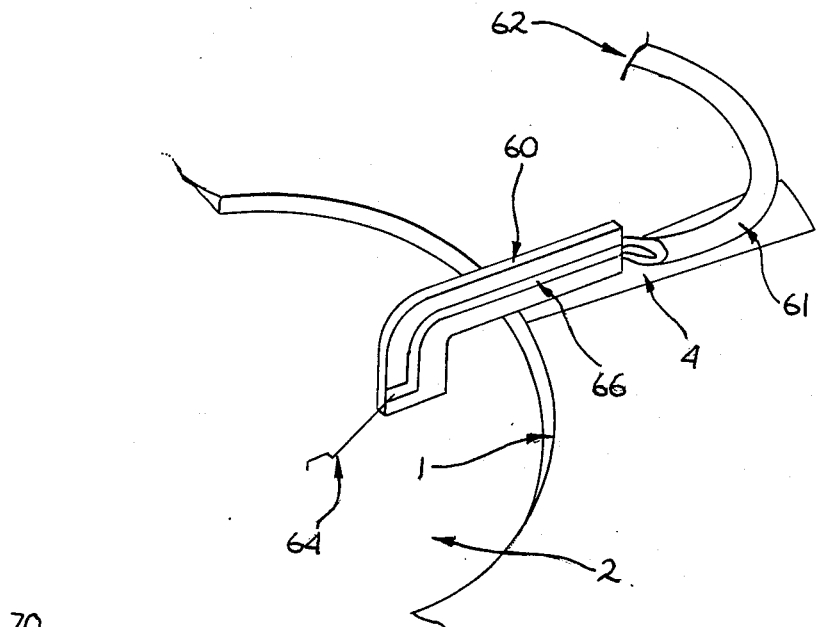
FIG. 6 is a perspective view of a single blade edge sensor as used in the present invention.

FIG. 6 discloses a single blade edge/sense probe 60 as used in the present invention. The probe card 1 is designed to use the single blade edge/sensor probe 60 in any of the four edge/sensor finger locations 4. The probe tip 64 of the edge/sensor probe 60 is electrically coupled through a trace 66 to a 2-conductor flying lead 62. The 2-conductor flying lead 62 is contained in a jacket 61 which is glued to the edge sensor finger 4. The 2-conductor flying lead 62 extends approximately 12 inches from the edge of the probe card and is terminated in a mini phone plug. The edge/sensor acts as a limit switch for detecting when the probe is in contact with the circuit.

Figure 7:
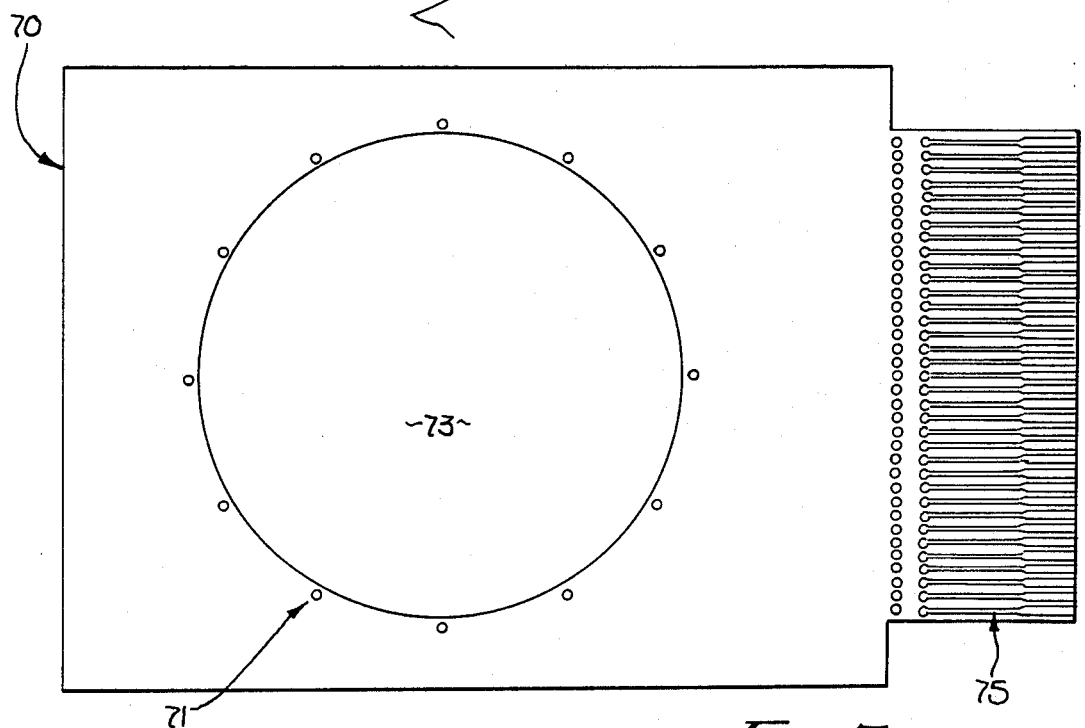
FIG. 7 is a top side view of an alignment adapter card used for assembly and repair of the probe card as disclosed in the present invention.

In order to manufacture the probe card 1 a method of mounting the probe card and connecting to it is disclosed. A standard jig for aligning and planarizing probe cards takes a 4.5 inch wide rectangular probe card. To provide for planarizing of the present invention, a rectangular board 70 is made as disclosed in FIG. 7. The rectangular board 70 has a 3.5 inch round hole 73 in the center and mounting holes 71 around the edge of the hole 73. The probe card 1 is mounted on the rectangular board 70 and the mounting holes 2 of the probe card 1 are aligned with the mounting holes 71 of the rectangular card 70.

Figure 8:
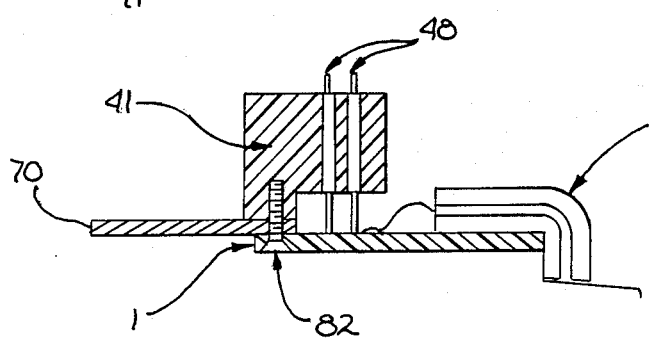
FIG. 8 is a one-half cross sectional view of the probe card mounted on an adapter card as used in the present invention.

FIG. 8 discloses the probe card alignment assembly. The alignment adapter card 70 and the probe card 1 are coupled with a Delrin TM ring 41 with screws 82. The Ceramic blade probe 53 is mounted on the probe card 1 and electrically coupled with the signal pad 8 on the probe card 1. Spring contact probes 48 in the Delrin TM ring 41 are electrically coupled to the signal pad 8 and the guard contact point 31.

On the alignment adapter card 70, the signal and guard pins 48 are connected together for each pin 48; this allows for checking for shorts between the guard fingers 7 while the alignment adapter card 70 is on the alignment jig. The signal and guard pins 48 are connected to the printed circuit edge connector 75 by jumper wires, allowing scrambling to be done.

Thus, an improved driven guard probe card is disclosed. The probe card is in the industry standard 4 inch round configuration in order to allow mounting to the standard hardware available from prober vendors and utilizes separate probe mounting fingers which act as driven guards for each probe. This provides proper guard potential to each different test signal on the various probes in use. An apparatus for conduction of the guard potential back from the test equipment is also disclosed. The features of the present invention greatly reduce or eliminate leakage and stray capacitance problems found in presently available probe cards.

I claim:

1. In the testing of integrated circuits where a probe card is used to provide electrical coupling between the integrated circuit and test equipment and where the test equipment provides a plurality of signals for driving shields, an improvement comprising:
   a plurality of electrically separate shields on the probe card; wherein each of said shields surrounds a pad on the top side of the probe card;
   each of said pads being for providing electrical coupling between a probe and the test equipment;
   the test equipment electrically coupled with said shields for driving each of said shields to the same electrical potential as an associated one of said signals received by said test equipment.

2. The improvement, as recited in claim 1 wherein said shields are on both sides of the probe card, and said shields opposite each other on each side of the probe card, are electrically coupled with each other;
   each of said pads being surrounded on all edges and from beneath by an associated one of said shields for providing a driven guard for said pad.

3. The improvement, as recited in claim 2, wherein said probes comprise:
   a probe blade;
   a trace coupled with said probe blade for providing electrical coupling between a connecting wire and a probe tip;
   said probe tip coupled with said trace and the integrated circuit for providing electrical coupling between said trace and the integrated circuit;
   said connecting wire coupled with said trace and said pad for providing electrical coupling between said trace and said pad;
   said probe blade having a ground plane on one side and on its mounting surface;
   said ground planes being electrically coupled with said shields for driving said ground planes to the same electrical potential as the signal received by the testing equipment from the integrated circuit.

4. The improvement, as recited in claim 3, wherein said pad comprises a signal contact point and a neck area; said signal contact point for providing electrical coupling with the testing equipment and said neck area for providing electrical coupling with said connecting wire.

5. The improvement, as recited in claim 4, wherein said signal contact point is electrically coupled with the testing equipment through a first spring contact pin mounted in a tester assembly.

6. The improvement, as recited in claim 5, wherein said shield is electrically coupled with the testing equipment through a second spring contact pin mounted in the tester assembly.

7. The improvement, as recited in claim 6, wherein said probe is made of a ceramic material.

8. The improvement, as recited in claim 7, further comprising an edge/sensor connection area and an edge/sensor probe for detecting when said edge/sensor probe is in contact with the integrated circuit.

9. In the testing of integrated circuits where a round probe card is used to provide electrical coupling between the integrated circuit and test equipment and where the test equipment provides a plurality of signals for driving a shield, an improvement comprising:
   a plurality of electrically separate fingers along the top and bottom side of the probe card running from the outside edge of the probe card to a hole in the center of the probe card;
   a plurality of probes coupled with said fingers and electrically coupled with the integrated circuit and with the test equipment;
   each said finger surrounding a pad on the top side of the probe card;
   each of said pads providing electrical coupling between an associated one of said probes and the test equipment;
   the test equipment being electrically coupled with said fingers through spring contact pins for driving said fingers to the same electrical potential as the signal received by the testing equipment through an associated one of said probes from the integrated circuit.

10. The improvement, as recited in claim 9, wherein said probes comprise:
    a probe blade;
    a wire trace coupled with said probe blade for providing electrical coupling between a probe tip and a probe wire;
    said probe tip coupled with said trace and the integrated circuit for providing electrical coupling between said trace and the integrated circuit;
    said probe wire coupled with said trace and said pad for providing electrical coupling between said trace and said pad;
    said probe blade having a ground plane on one side and on its mounting surface;
    said ground plane being electrically coupled with said fingers for driving said ground planes to the same electrical potential as the signal received by the testing equipment from the integrated circuit.

11. The improvement, as recited in claim 10, wherein said pad comprises a signal contact point and a neck area; said signal contact point for providing electrical coupling with the testing equipment through spring contact probes and said neck area for providing electrical coupling with said connecting wire.

12. The improvement, as recited in claim 11, wherein the probe card is 4 inches in diameter and has a 1.1 inch diameter hole through the center.

13. A device for the testing of an integrated circuit comprising:
    a probe card having a plurality of electrically separate pads on top of said probe card;
    a probe blade;
    a trace coupled with said probe blade for providing electrical coupling between a connecting wire and a probe tip;
    said probe tip coupled with said trace and the integrated circuit for providing electrical coupling between said trace and the integrated circuit;
    said connecting wire coupled with said trace and an associated one of said pads for providing electrical coupling between said trace and an associated one of said pads;
    said probe blade having a ground plane on one side and on its mounting surface;
    said ground planes being electrically coupled with a shield for driving said ground planes to the same electrical potential as a signal received by the test equipment from the integrated circuit.

* * * * *